(12) United States Patent
Cheng et al.

(10) Patent No.: US 10,872,850 B2
(45) Date of Patent: Dec. 22, 2020

(54) PACKAGE STRUCTURE AND METHOD OF FORMING THEREOF

(71) Applicant: TAIWAN SEMICONDUCTOR MANUFACTURING CO., LTD., Hsinchu (TW)

(72) Inventors: Li-Hui Cheng, New Taipei (TW); Po-Hao Tsai, Taoyuan (TW); Jing-Cheng Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/625,824

(22) Filed: Jun. 16, 2017

(65) Prior Publication Data
US 2018/0286793 A1    Oct. 4, 2018

Related U.S. Application Data

(60) Provisional application No. 62/479,007, filed on Mar. 30, 2017.

(51) Int. Cl.
*H01L 23/00* (2006.01)
*H01L 23/498* (2006.01)
*H01L 23/538* (2006.01)

(52) U.S. Cl.
CPC .. *H01L 23/49816* (2013.01); *H01L 23/49838* (2013.01); *H01L 24/03* (2013.01); *H01L 24/11* (2013.01); *H01L 24/14* (2013.01); *H01L 24/19* (2013.01); *H01L 23/5389* (2013.01); *H01L 2224/023* (2013.01); *H01L 2224/10126* (2013.01); *H01L 2224/13022* (2013.01)

(58) Field of Classification Search
CPC ...................................................... H01L 24/13
See application file for complete search history.

(56) References Cited

U.S. PATENT DOCUMENTS

| | | | |
|---|---|---|---|
| 5,869,904 A * | 2/1999 | Shoji | ........ H01L 24/11 257/779 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |

(Continued)

FOREIGN PATENT DOCUMENTS

JP    2013055272 A *    3/2013

*Primary Examiner* — Peniel M Gumedzoe
*Assistant Examiner* — Christopher A Johnson
(74) *Attorney, Agent, or Firm* — Maschoff Brennan

(57) ABSTRACT

A package structure includes a semiconductor device, a first redistribution line, a dielectric layer, a first conductive bump and a first sealing structure. The dielectric layer is over the first redistribution line and has a first opening therein. The first conductive bump is partially embedded in the first opening and electrically connected to the first redistribution line. The first sealing structure surrounds a bottom portion of the first conductive bump. The first sealing structure has a curved surface extending from an outer surface of the bottom portion of the first conductive bump to a top surface of the dielectric layer.

20 Claims, 13 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 2003/0201309 A1* | 10/2003 | Grigg | H01L 24/11 228/207 |
| 2004/0027788 A1* | 2/2004 | Chiu | H01L 21/563 361/329 |
| 2004/0266162 A1* | 12/2004 | Feng | H01L 24/11 438/613 |
| 2011/0272819 A1* | 11/2011 | Park | H01L 24/02 257/774 |
| 2011/0285008 A1* | 11/2011 | Nakano | H01L 24/03 257/692 |
| 2015/0228587 A1* | 8/2015 | Cheng | H01L 23/544 257/777 |
| 2017/0025397 A1* | 1/2017 | Hung | H01L 23/481 |

* cited by examiner

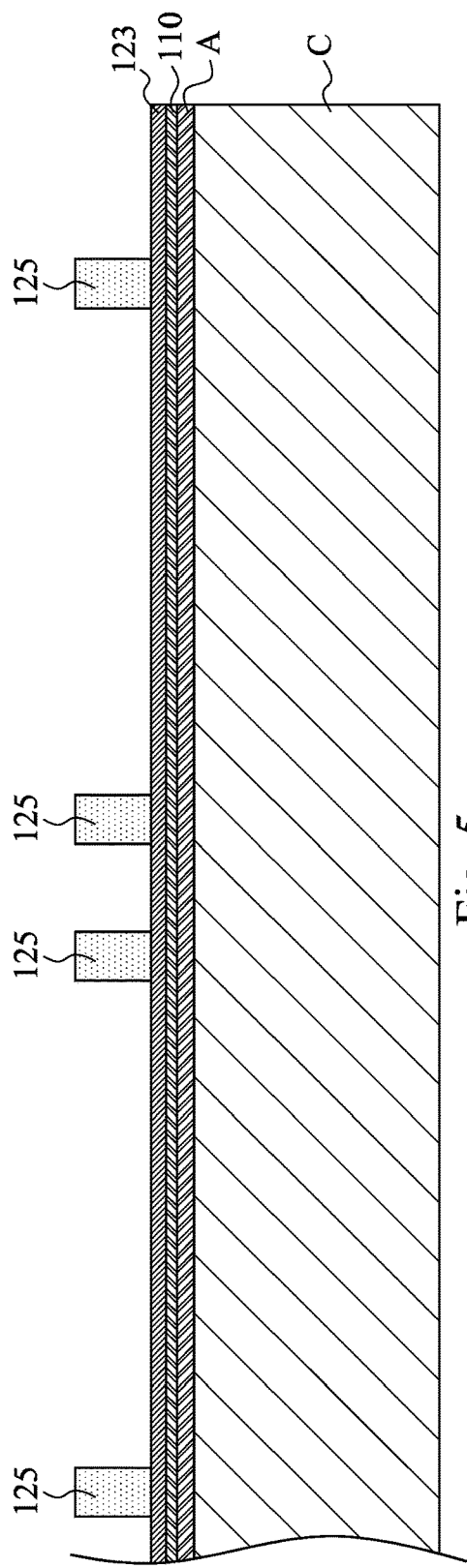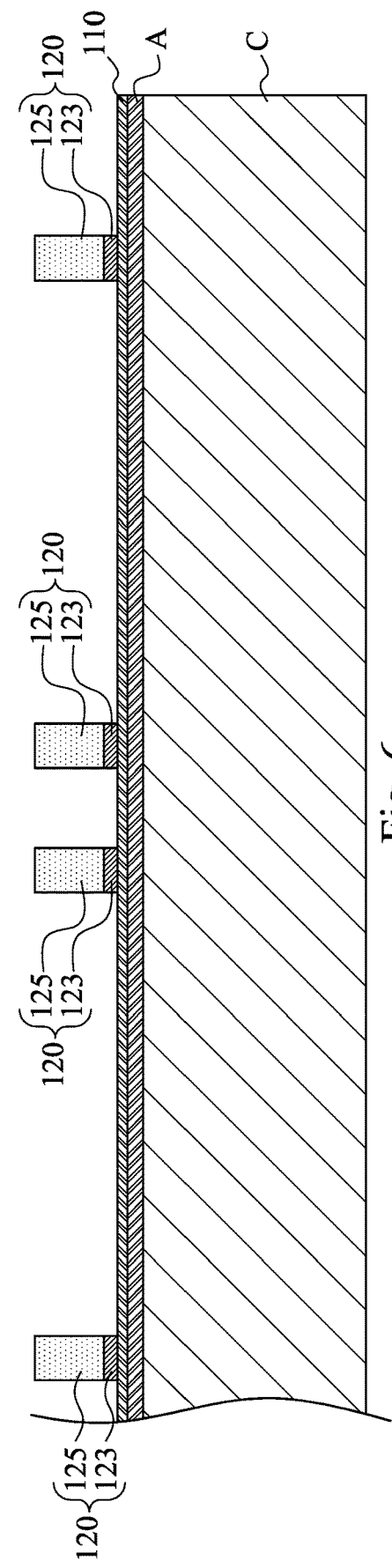

PACKAGE STRUCTURE AND METHOD OF FORMING THEREOF

PRIORITY CLAIM AND CROSS-REFERENCE

This application claims priority to U.S. Provisional Application Ser. No. 62/479,007, filed Mar. 30, 2017, which is herein incorporated by reference.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-19 illustrate a method of manufacturing a package structure in accordance with some embodiments of the present disclosure.

DETAILED DESCRIPTION

Figure 1:
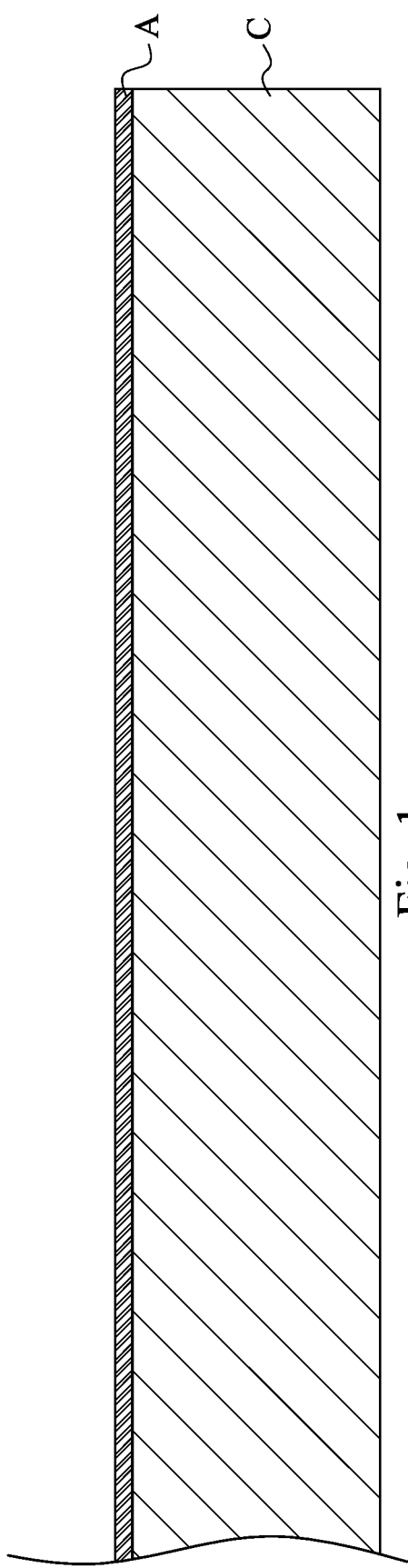

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1-19 illustrate a method of manufacturing a package structure in accordance with some embodiments of the present disclosure. Referring to FIG. 1, an adhesive layer A is formed on a carrier C. The carrier C may be a blank glass carrier, a blank ceramic carrier, or the like. The adhesive layer A may be made of an adhesive, such as ultra-violet (UV) glue, light-to-heat conversion (LTHC) glue, or the like, although other types of adhesives may be used. In some embodiments, the adhesive layer A may be made of a polymer such as polymer resin.

Figure 2:
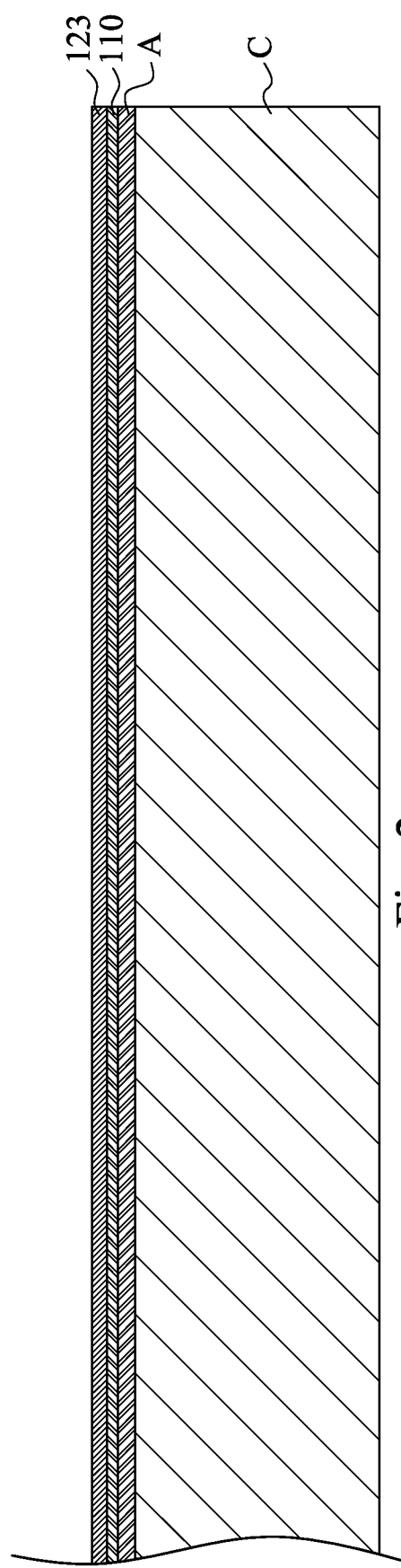

Referring to FIG. 2, a buffer layer 110 is formed over the adhesive layer A. The buffer layer 110 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like. The buffer layer 110 is a substantially planar layer having a substantially uniform thickness, in which the thickness may be greater than about 2 μm, and may be in a range from about 2 μm to about 40 μm. In some embodiments, top and bottom surfaces of the buffer layer 110 are also substantially planar.

A seed layer 123 is formed on the buffer layer 110, for example, through physical vapor deposition (PVD) or metal foil laminating. The seed layer 123 may include copper, copper alloy, aluminum, titanium, titanium alloy, or combinations thereof. In some embodiments, the seed layer 123 includes a titanium layer and a copper layer over the titanium layer. In alternative embodiments, the seed layer 123 is a copper layer. In some embodiments, a seed layer 123 is formed directly on the adhesive layer A when no buffer layer 110 is used.

Figure 3:
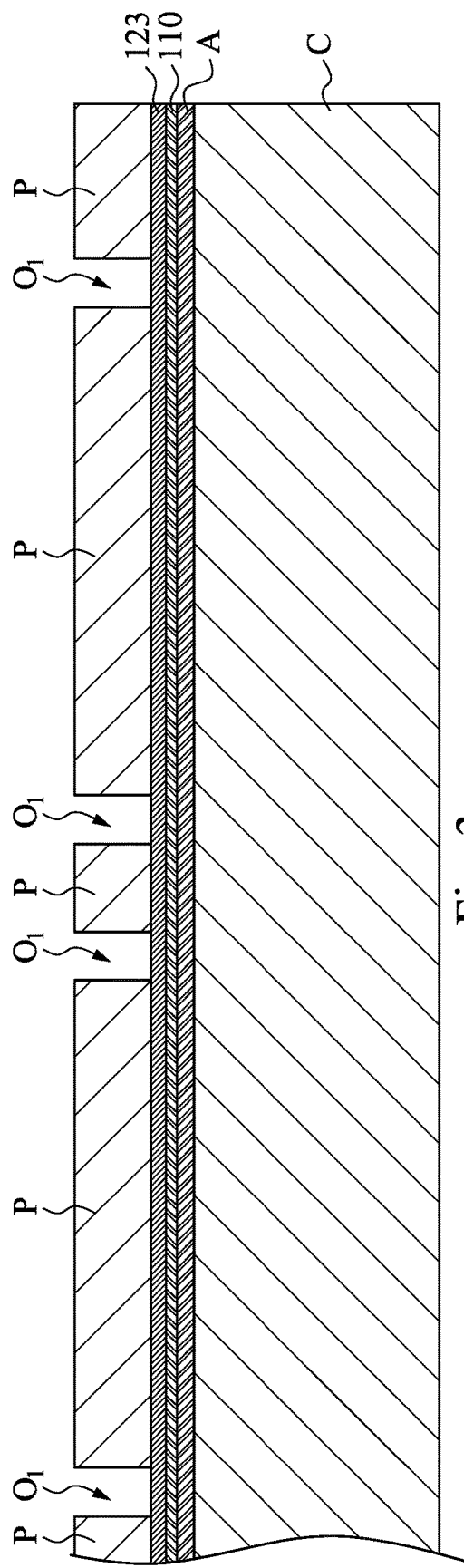

Referring to FIG. 3, a photo resist P is applied over the seed layer 123 and is then patterned. As a result, openings $O_1$ are formed in the photo resist P, through which some portions of the seed layer 123 are exposed.

Figure 4:
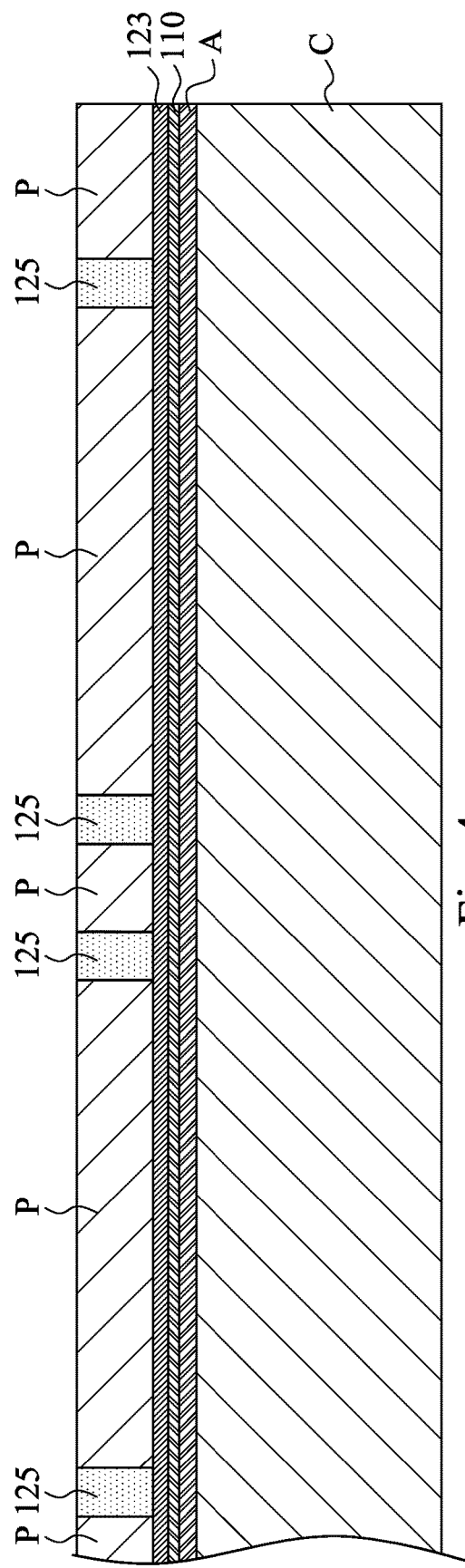

As shown in FIG. 4, conductive features 125 are formed in openings $O_1$ of the photo resist P through plating, which may be electro plating or electro-less plating. The conductive features 125 are plated on the exposed portions of the seed layer 123. The conductive features 125 may include copper, aluminum, tungsten, nickel, solder, or alloys thereof. Top-view shapes of the conductive features 125 may be rectangles, squares, circles, or the like. Heights of the conductive features 125 are determined by the thickness of the subsequently placed first semiconductor devices 130 (FIG. 7), with the heights of the conductive features 125 greater than the thickness of the first semiconductor devices 130 in some embodiments of the present disclosure. After the plating of the conductive features 125, the photo resist P is removed, and the resulting structure is shown in FIG. 5. After the photo resist P is removed, some portions of the seed layer 123 are exposed.

Referring to FIG. 6, an etch step is performed to remove the exposed portions of seed layer 123, wherein the etch step may include an anisotropic etching. Some portions of the seed layer 123 that are covered by the conductive features 125, on the other hand, remain not etched. Throughout the description, the conductive features 125 and the remaining underlying portions of the seed layer 123 are in combination referred to as through integrated fan-out (InFO) vias (TIVs) 120, which are also referred to as through-vias. Although the seed layer 123 is shown as a layer separate from the conductive features 125, when the seed layer 123 is made of a material similar to or substantially the same as the respective overlying conductive features 125, the seed layer 123 may be merged with the conductive features 125 with no distinguishable interface therebetween. In alternative embodiments, there exist distinguishable interfaces between the seed layer 123 and the overlying conductive features 125.

Figure 7:
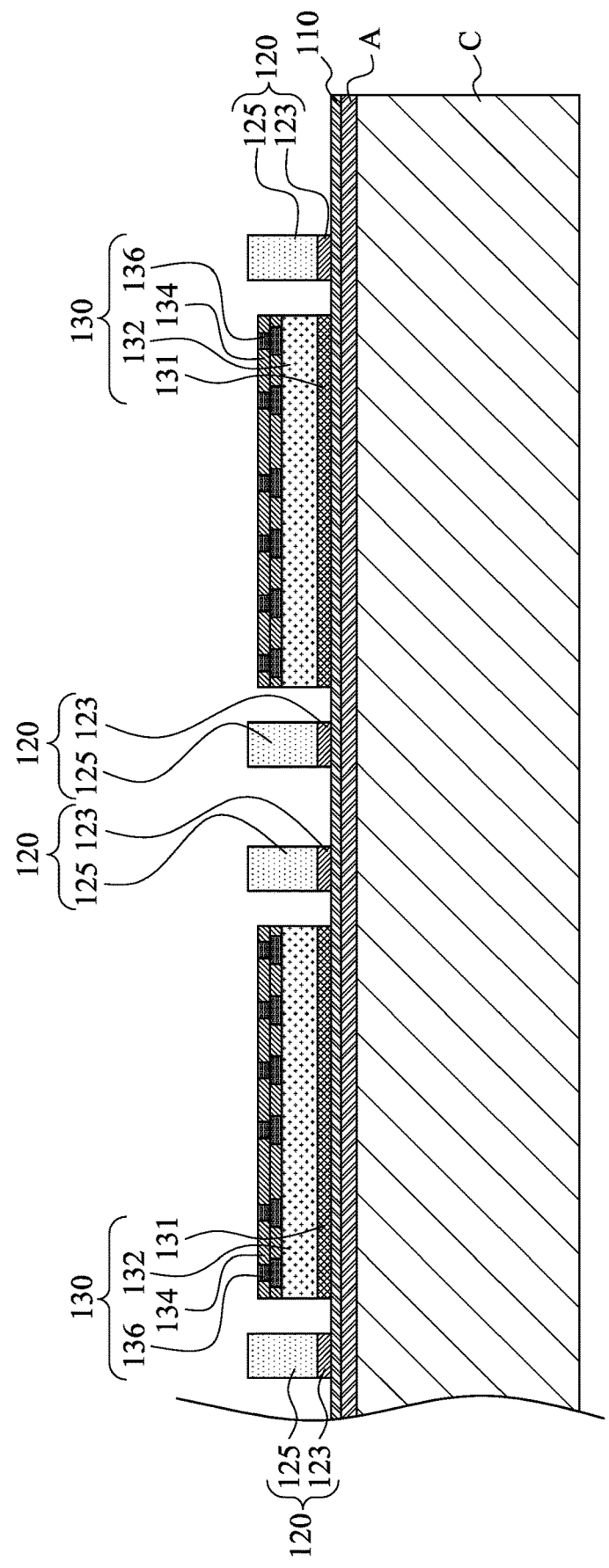

FIG. 7 illustrates placement of first semiconductor devices 130 over the buffer layer 110. The first semiconductor devices 130 may be adhered to the buffer layer 110 through adhesive layers 131. In some embodiments, the first semiconductor devices 130 are unpackaged semiconductor devices, i.e. device dies. For example, the first semiconductor devices 130 may be logic device dies including logic transistors therein. In some exemplary embodiments, the first semiconductor devices 130 are designed for mobile applications, and may be central computing unit (CPU) dies, power management integrated circuit (PMIC) dies, transceiver (TRX) dies, or the like. Each of the first semiconductor devices 130 includes a semiconductor substrate 132 (a silicon substrate, for example) that contacts the adhesive layer 131, wherein the back surface of the semiconductor substrate 132 is in contact with the adhesive layer 131.

In some exemplary embodiments, conductive pillars 136 (such as copper posts) are formed as the top portions of the first semiconductor devices 130, and are electrically coupled to the devices such as transistors (not shown) in the first semiconductor devices 130. In some embodiments, a dielectric layer 134 is formed on the top surface of the respective first semiconductor device 130, with the conductive pillars 136 having at least lower portions in the dielectric layer 134. The top surfaces of the conductive pillars 136 may be substantially level with the top surfaces of the dielectric layers 134 in some embodiments. Alternatively, the dielectric layers are not formed, and the conductive pillars 136 protrude from a top dielectric layer (not shown) of the respective first semiconductor devices 130.

Figure 8:
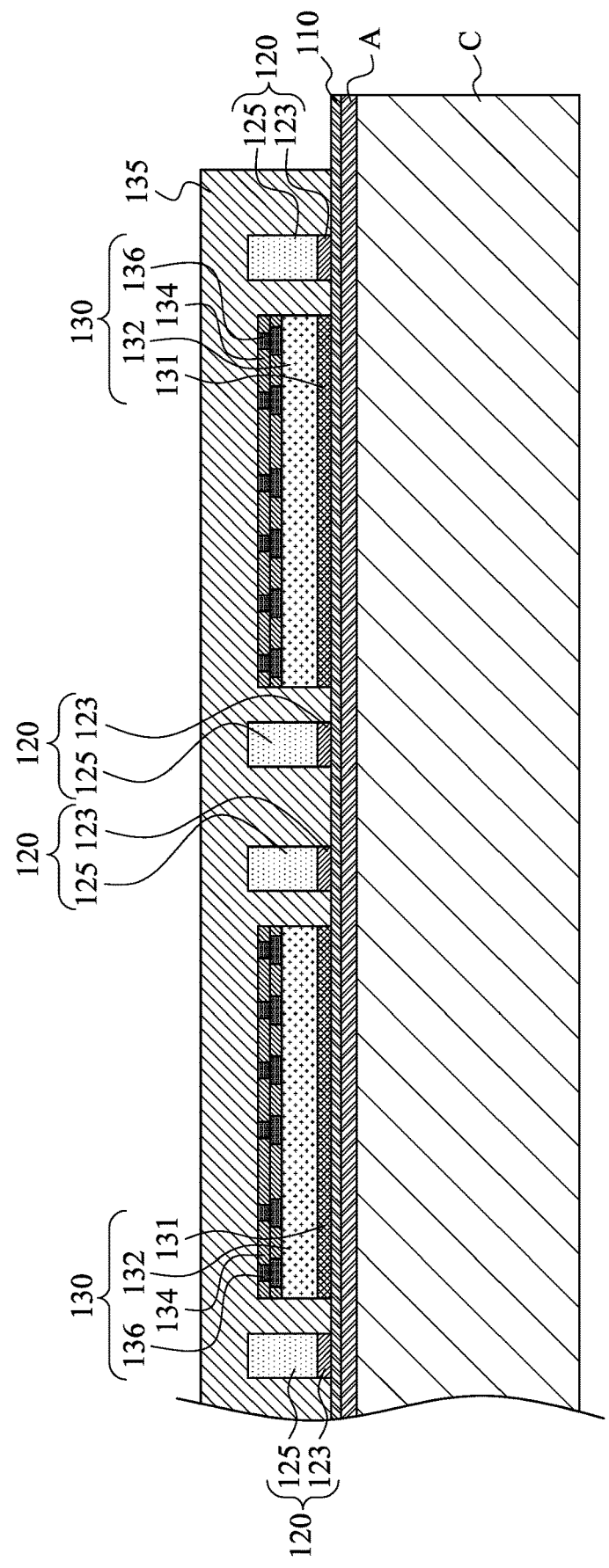

Referring to FIG. 8, a molding material 135 is molded on the first semiconductor devices 130 and the TIVs 120. The molding material 135 fills gaps between the first semiconductor devices 130 and the TIVs 120, and may be in contact with the buffer layer 110. Furthermore, the molding material 135 is filled into gaps between the conductive pillars 136 when the conductive pillars 136 are protruding metal pillars (this arrangement is not shown). The top surface of the molding material 135 is higher than the top ends of the conductive pillars 136 and the TIVs 120.

In some embodiments, the molding material 135 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 9:
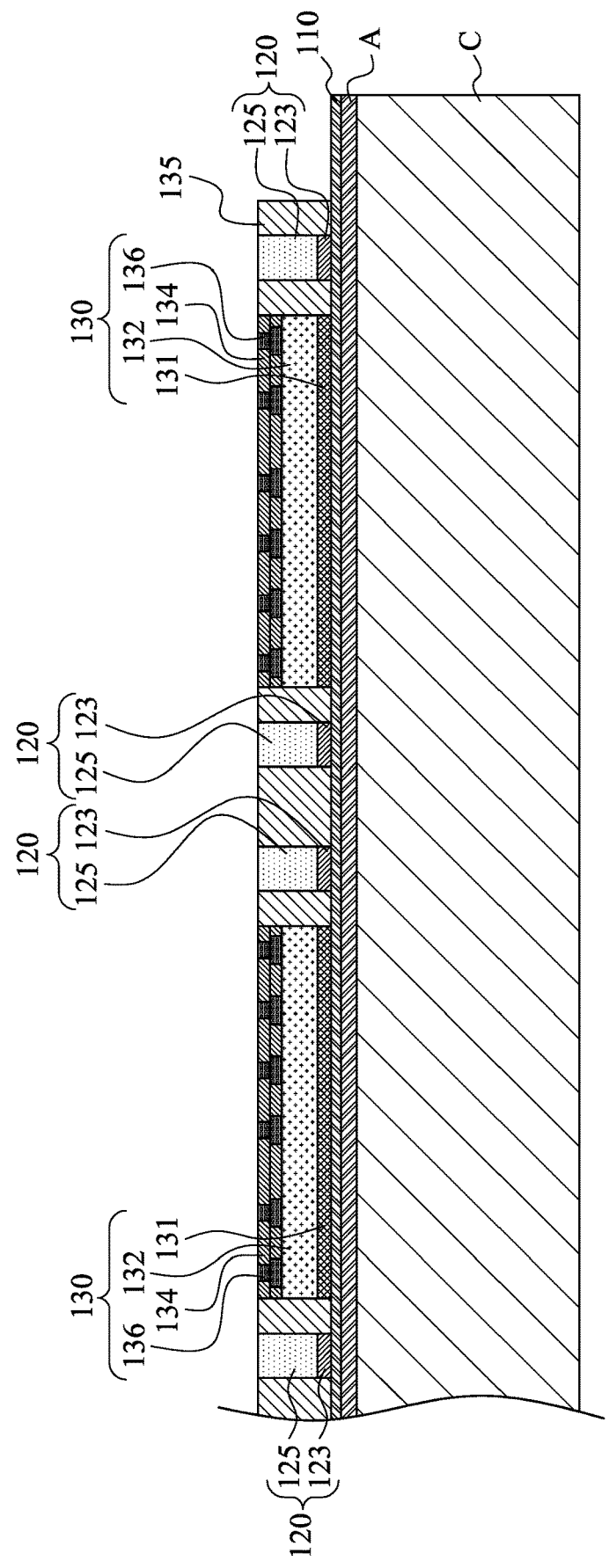

Next, a grinding step is performed to thin the molding material 135, until the conductive pillars 136 and the TIVs 120 are exposed. The resulting structure is shown in FIG. 9, in which the molding material 135 is in contact with sidewalls of the first semiconductor devices 130 and the TIVs 120. Due to the grinding, the top ends of the TIVs 120 are substantially level (coplanar) with the top ends of the conductive pillars 136, and are substantially level (coplanar) with the top surface of the molding material 135. As a result of the grinding, conductive residues such as metal particles may be generated, and left on the top surface of the structure shown in FIG. 9. Accordingly, after the grinding, a cleaning may be performed, for example, through a wet etching, so that the conductive residues are removed.

Figure 10:
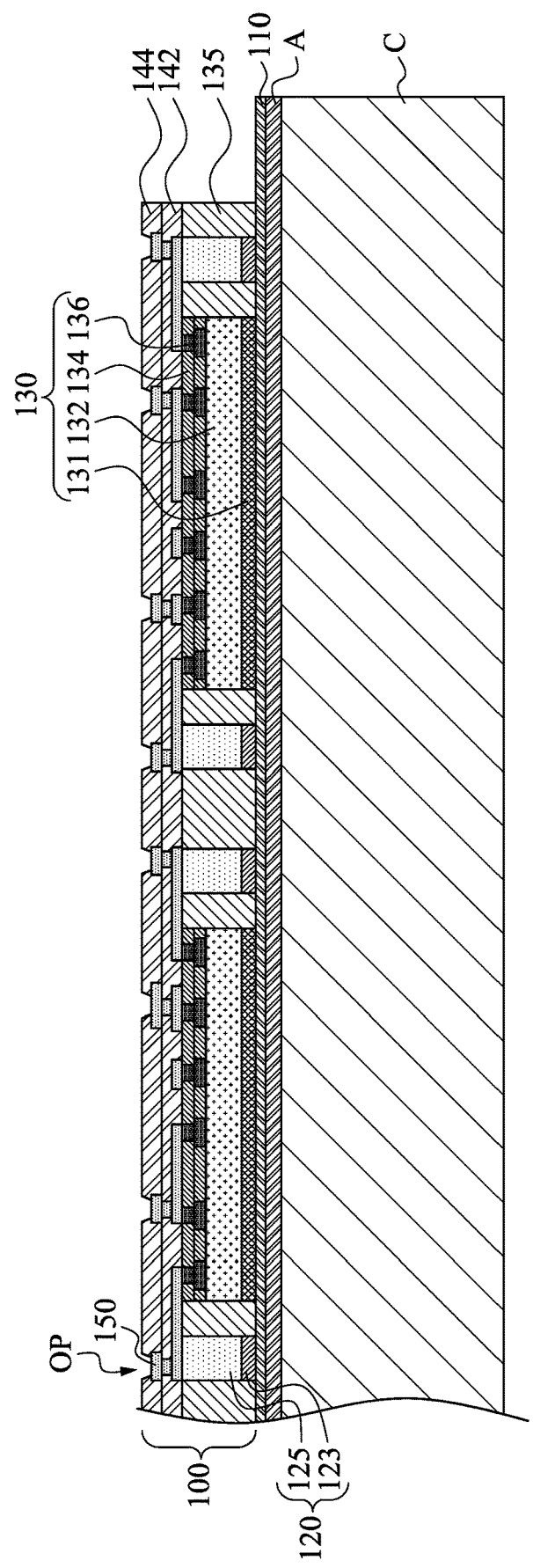

Next, referring to FIG. 10, redistribution lines (RDLs) 150 are formed over the molding material 135 to connect to the conductive pillars 136 and the TIVs 120. The RDLs 150 may also interconnect the conductive pillars 136 and the TIVs 120. In accordance with some embodiments, dielectric layers 142 and 144 are formed over the first semiconductor devices 130, the molding material 135 and the TIVs 120, with the RDLs 150 formed in the dielectric layers 142 and 144. In some embodiments, the formation of one layer of the RDLs 150 includes forming a blanket seed layer such as copper, titanium or combinations thereof, forming and patterning a mask layer over the blanket seed layer, performing a plating to form the RDLs 150, removing the mask layer, and performing a flash etching to remove the portions of the blanket seed layer not covered by the RDLs 150. In some embodiments, after formation of the bottom dielectric layer 142 and the RDLs 150, the top dielectric layer 144 can be formed over the RDLs 150 and the bottom dielectric layer 142. The top dielectric layer 144 may be made by any suitable method such as spin coating or lamination and an optional curing step. The top dielectric layer 144 is patterned to form a plurality of openings OP that expose portions of RDLs 150. The openings OP may be arranged in a grid pattern of rows and columns that corresponds a subsequently formed ball grid array (BGA). The patterning of the top dielectric layer 144 may include photolithography techniques.

In some embodiments, the RDLs 150 may include a metal or a metal alloy including aluminum, copper, tungsten, and/or alloys thereof. Throughout the description, the combined structure including the buffer layer 110, the first semiconductor devices 130, the TIVs 120, the molding material 135, the RDLs 150, and the dielectric layers 142 and 144 is referred to as a TIV package 100, which may be a composite wafer.

FIG. 10 illustrates two layers of the RDLs 150, while there may be one or more than two layers of the RDLs, depending on the routing design of the respective package. The dielectric layers 142 and 144 in these embodiments may include a polymer such as polyimide, benzocyclobutene (BCB), polybenzoxazole (PBO), or the like. Alternatively, the dielectric layers 142 and 144 may include non-organic dielectric materials such as silicon oxide, silicon nitride, silicon carbide, silicon oxynitride, or the like.

Figure 11:
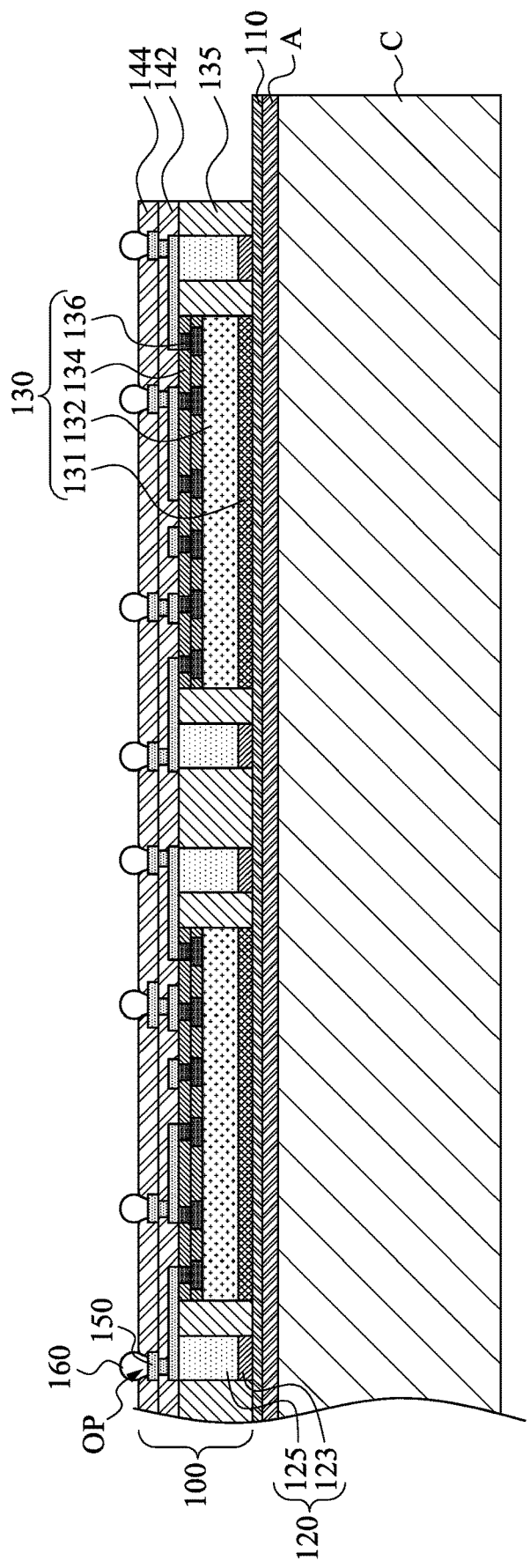

Next, referring to FIG. 11, conductive bumps 160 are placed on the RDLs 150 through the openings OP in the top dielectric layer 144. In other words, the conductive bumps 160 are respectively in contact with the RDLs 150, so that the conductive bumps 160 can be electrically connected to the RDLs 150. Specifically, the conductive bumps 160 are partially embedded in openings OP in the top dielectric layer 144 respectively. The conductive bumps 160 may be a ball grid array (BGA) which comprises a eutectic material such as solder, although any suitable materials may alternatively be used. In some embodiments where the conductive bumps 160 are solder balls, the conductive bumps 160 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the conductive bumps 160 have been formed, a test may be performed to ensure that the structure is suitable for further processing.

In the depicted embodiments, the conductive bumps 160 are in contact with the top dielectric layer 144 and the RDLs 150. In other words, under bump metallization (UBM) structures are absent below the conductive bumps 160, and hence cost for forming UBM structures can be saved. Therefore, absence of the UBM structures may be advantageous to reduce the cost of manufacturing the package structure. However, if there is no UBM structure between the conductive bump 160 and the top dielectric layer 144, the conductive bumps 160 may have weak bump strength, the RDLs 150 may tend to crack due to poor stress buffer, and the top dielectric layer 144 may delaminate from an interface between the top dielectric layer 144 and the RDLs 150. Moreover, delamination of the top dielectric layer 144 causes gaps or voids between the conductive bumps 160 and the top dielectric layer 144 or between the top dielectric layer 144 and the RDLs 150, and hence moisture may penetrate through these gaps or voids between the conductive bumps 160 and the top dielectric layer 144, and also penetrate the gaps between the top dielectric layer 144 and RDLs 150. As a result, some embodiments of the present disclosure employ sealing structures to prevent the peeling (or delamination) as well as the penetration of moisture, and also block the stress penetrating the underlying RDLs and dielectrics, as discussed below.

Figure 12:
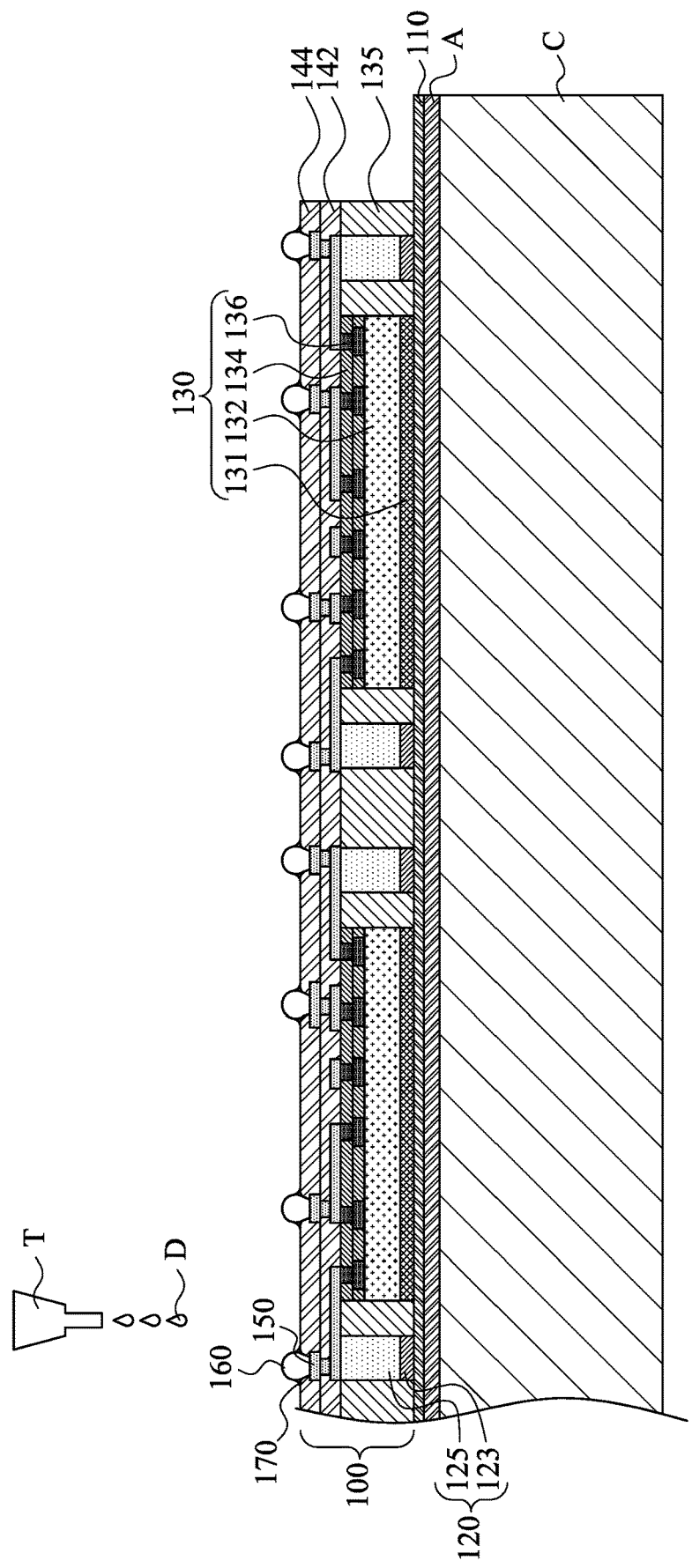
Figure 13:
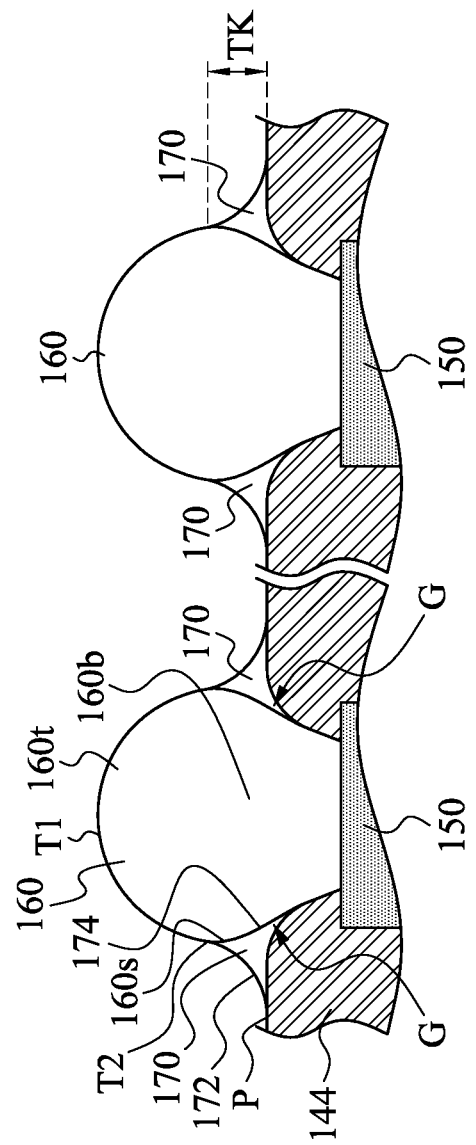
Figure 14:
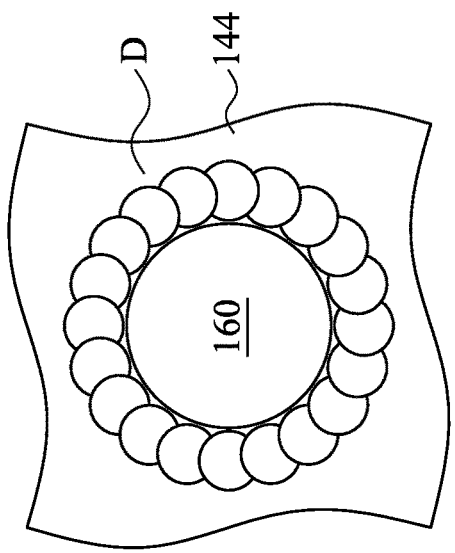

FIG. 12 illustrates formation of sealing structures 170 on the top dielectric layer 144, and FIG. 13 is an enlarged view of the sealing structures 170. As shown in FIGS. 12 and 13, the sealing structures 170 are formed on the top dielectric layer 144 to seal gaps between the conductive bumps 160 and the top dielectric layer 144, such as gap G as shown in FIG. 13. For example, a portion of the sealing structure 170 fills the gap G between the conductive bump 160 and the top dielectric layer 144. In other words, a portion of the sealing structure 170 is between the conductive bump 160 and the top dielectric layer 144. In some embodiments, the sealing structures 170 can be dispensed using a dispensing tool T, such as a jet printing tool. The dispensing tool T can dispense or eject sealing material droplets D around each conductive bump 160, as illustrated in FIG. 14. The dispensing tool T is oriented so that the sealing material droplets D are directed toward the top surface of the top dielectric layer 144. The sealing material droplets D may be dispensed along the edge of the conductive bump 160 as well as the top surface of the top dielectric layer 144. Due to capillary action, the sealing material droplets D around the conductive bumps 160 flow into gaps between the conductive bumps 160 and the top dielectric layer 144 (e.g. gaps G as shown in FIG. 13), such that these gaps between the conductive bumps 160 and the top dielectric layer 144 can be sealed by the sealing material droplets D. Stated differently, the gaps between the conductive bumps 160 and the top dielectric layer 144 can be filled by the sealing material droplets D due to capillary action, as shown in FIG. 13. In some embodiments, the sealing material droplets D may flow into gaps between the top dielectric layer 114 and the RDLs 150. After the sealing material droplets D are dispensed, an optional curing process may be performed to harden the sealing material droplets D to form the sealing structures 170 extending into gaps G between the conductive bumps 160 and the top dielectric layer 144.

As illustrated in FIG. 13, the sealing material droplets D climb on bottom portions 160b of the conductive bumps 160 due the capillary action, and hence sealing structures 170 formed by the cured droplets D surround bottom portions 160b of the conductive bumps 160 respectively. The sealing material droplets D do not climb on top portions 160t of the conductive bumps 160, and hence the top portions 160t are free of the sealing structures 170. For example, tops T1 of the conductive bumps 160 are in positions higher than tops T2 of the sealing structures 170. In some embodiments, the sealing structure 170 includes an outer surface 172 extending from a sidewall 160s (or referred to as outer surface) of the conductive bump 160 to a top surface of the top dielectric layer 144. More particularly, the outer surface 172 of the sealing structure 170 extends from the sidewall 160s of the conductive bump 160 to a position P spaced apart from the conductive bump 160, wherein the position P is at the top surface of the top dielectric layer 144. Stated differently, the outer surface 172 is in contact with the top surface of the top dielectric layer 144. Moreover, the outer surface 172 is also in contact with the sidewall 160s of the conductive bump 160. In some embodiments, a vertical distance from a top end of the sealing structure 170 to the RDL 150 is greater than a vertical distance from the top surface of the top dielectric layer 144 to the RDL 150. In some embodiments, the sealing structure 170 has a thickness TK ranging from about 2 um to about 80 um.

In some embodiments, the outer surface 172 of the sealing structure 170 is curved due to the capillary action. In other words, a slope of the outer surface 172 changes as a function of height. In some embodiments, curving of the outer surface 172 begins from the sidewall 160s of the bottom portion 160b of the conductive bump 160 to the position P at the top surface of the top dielectric layer 144. For example, as illustrated in FIG. 13, the outer surface 172 is a concave surface. In other words, the slope of the outer surface 172 increases as a thickness of the sealing structure 170 increases. In some embodiments, a concave curvature of the outer surface 172 begins from the conductive bump 160 to the top dielectric layer 144.

In some embodiments, as illustrated in FIG. 13, a curvature of the outer surface 172 is different from a curvature of the sidewall 160s of the conductive bump 160. The sealing structure 170 and the sidewall 160s of the conductive bump 160 forms an interface 174, and hence the interface 174 of the sealing structure 170 and the conductive bump 160 is conformal to the sidewall 160s of the conductive bump 160. Because the interface 174 of the sealing structure 170 and the conductive bump 160 is conformal to the sidewall 160s of the conductive bump 160, the interface 174 has a curvature substantially the same as the curvature of the sidewall 160s. Therefore, the outer surface 172 and the interface 174 have different curvatures. In some embodiments, the outer surface 172 and the interface 174 share a same boundary. More particularly, the outer surface 172 coincides with the interface 174 at the sidewall 160s of the conductive bump 160.

FIG. 13 illustrates two neighboring conductive bumps 160 (i.e. one bump 160 next to another bump 160). Sealing structures 170 are arranged between the two neighboring conductive bumps 160. In some embodiments, the sealing material droplets D are dispensed at intervals such that the sealing structures 170 are spaced apart. In other words, the sealing structures 170 between neighboring conductive bumps 160 are separated. In some embodiments, since the sealing structures 170 between the neighboring conductive bumps 160 are dispensed in the same dispensing process, the sealing structures 170 can have the same material, such as polymer. The polymer may include, for example, polyimide, polybenzoxazole (PBO), a solder resist film (SR), molding compound, resin or other suitable sealing materials. In some embodiments, the sealing structures 170 between neighboring conductive bumps 160 are not separated.

In some embodiments, as illustrated in FIG. 14, one sealing material droplet D is dispensed on a portion of another sealing material droplet D. In other words, neighboring sealing material droplets D are partially overlapped over the top dielectric layer 144, and hence the sealing material droplets D around the conductive bump 160 are connected as a ring or an annular structure enclosing the conductive bump 160. Such a configuration may be advantageous to improve sealing of the gap between the conductive bump 160 and the top dielectric layer 144 (e.g. gap G shown in FIG. 13). Stated differently, the sealing structures 170 around a conductive bump 160 are merged together as a ring or an annular structure enclosing the conductive bump 160, such that sealing of the gap between the conductive bump 160 and the top dielectric layer 144 can be improved. Merging of the sealing structures 170 can be achieved by controlling one or more parameters of dispensing the sealing material droplets D, such as intervals of the sealing material droplets D or the like.

Figure 15:
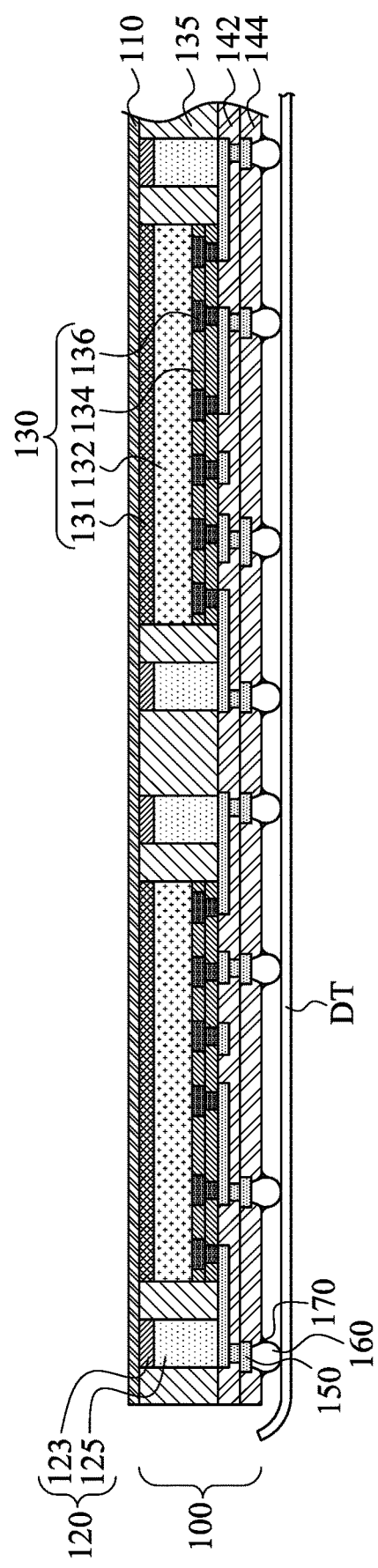

Next, the TIV package 100 is de-bonded from the carrier C. The adhesive layer A is also cleaned from the TIV package 100. As a result of the removal of the adhesive layer A, the buffer layer 110 is exposed. The resulting structure is shown in FIG. 15. Referring to FIG. 15, the TIV package 100 with the conductive bumps 160 is further adhered to a dicing tape DT, wherein the conductive bumps 160 may contact the dicing tape DT. In some embodiments, a laminating film (not shown) is placed onto the exposed buffer layer 110, wherein the laminating film may include SR, ABF, backside coating tape, or the like. In alternative embodiments, no laminating film is placed over the buffer layer 110.

Figure 16:
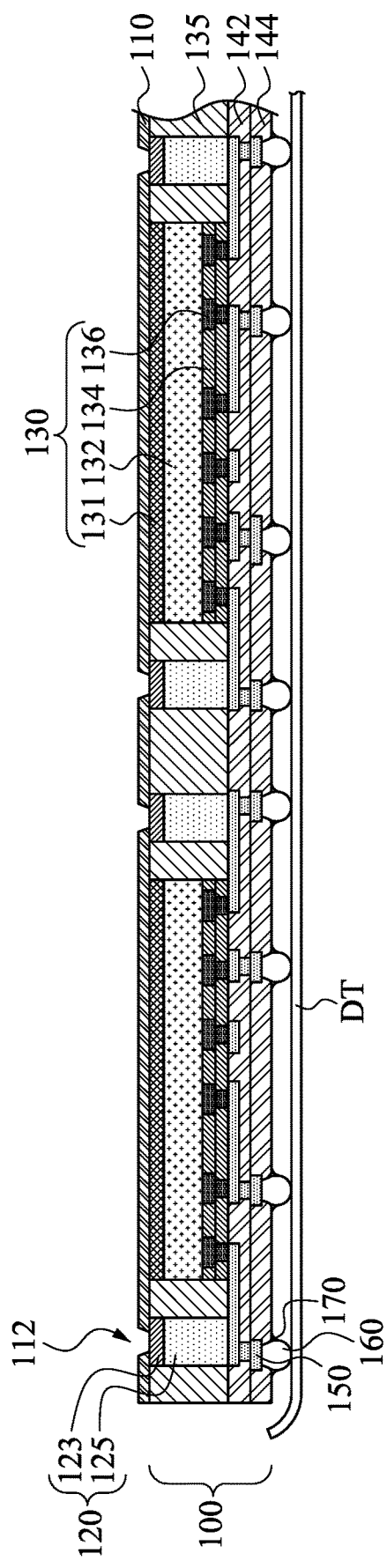

FIG. 16 illustrates a patterning of the buffer layer 110 in order to form opening 112 and expose the TIVs 120. In some embodiments, the buffer layer 110 may be patterned using, e.g., a laser drilling method. In some embodiments, a protective layer, such as a light-to-heat conversion (LTHC) layer or a hogomax layer (not shown) is first deposited over the buffer layer 110. Once protected, a laser is directed towards those portions of the buffer layer 110 which are desired to be removed in order to expose the underlying TIVs 120. After the laser drilling, a post-drill cleaning process is performed to remove residues during the laser drilling. In some embodiments, the laser drilling process may create a jagged profile or a rough profile, e.g., of a sidewall of the openings 112. In other words, the laser drilling process may expose sidewalls of the openings 112, and these sidewalls may have roughness greater than a top surface of the buffer layer 110 that does not undergo the laser drilling process.

In some other embodiments, the buffer layer 110 may be patterned by initially applying a photoresist to the buffer layer 110 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the buffer layer 110 are removed with, e.g., a dry etch process. However, any other suitable method for patterning the buffer layer 110 may alternatively be utilized.

Figure 17:
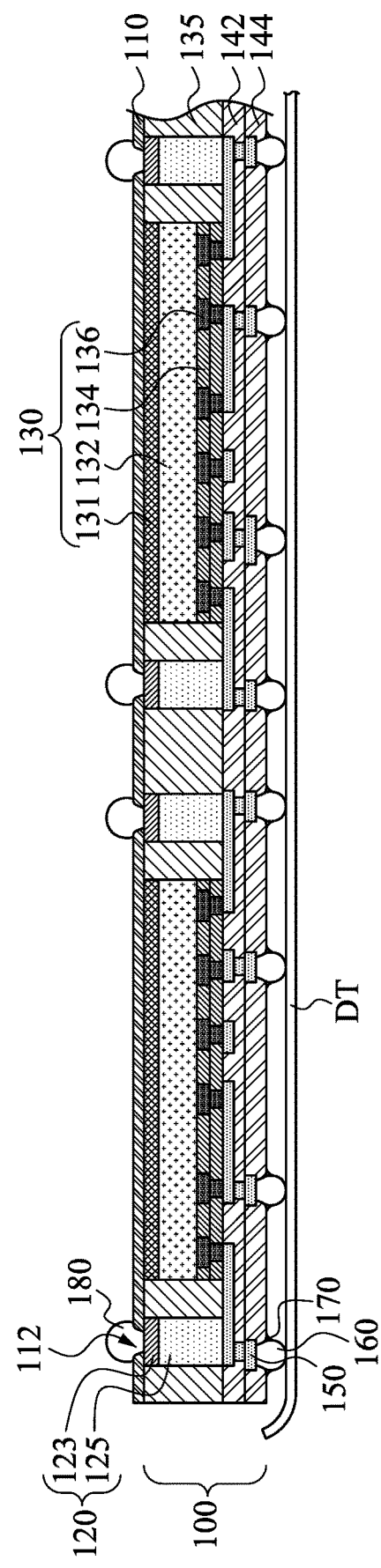

FIG. 17 illustrates placement of backside ball pads 180 within the openings 112 in order to protect the exposed TIVs 120. In some embodiments, the backside ball pads 180 may comprise a conductive material such as solder on paste (SOP) or an oxygen solder protection (OSP), although any suitable material may alternatively be utilized. In some embodiments, the backside ball pads 180 may be applied using a stencil, although any suitable method of application may alternatively be utilized, and then reflowed in order to form a bump shape.

Figure 18:
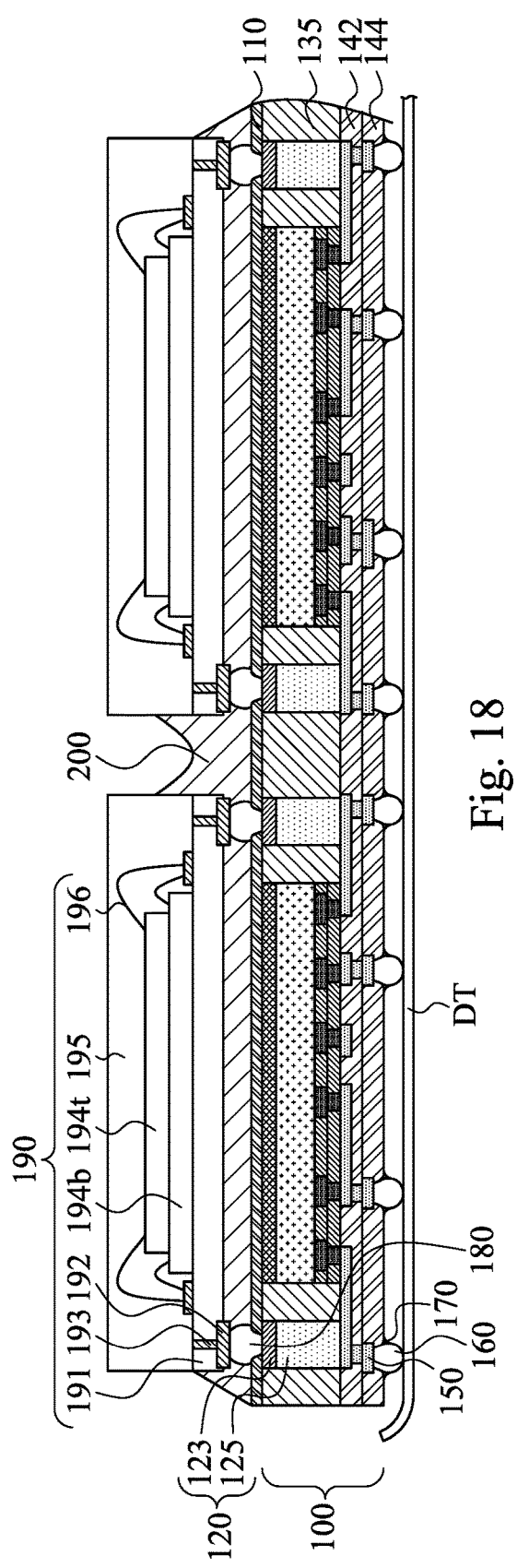

FIG. 18 illustrates bonding of second semiconductor devices 190 to the backside ball pads 180. Although the backside ball pads 180 are solder balls in the depicted embodiments, the embodiments are not limited to the use of solder balls. For example, the backside ball pads 180 can be copper columns, copper studs, controlled collapse chip connectors ("C4"), or other connectors suitable for connecting components to an underlying package or device. Further, the term "solder" as used in this description is not limited to any particular type and lead containing, or lead free, solder may be used. A solder ball of lead and tin (Pb/Sn) or Pb and additional materials may be used. In the alternative, lead free compositions including, as a non-limiting example, tin, silver and copper ("SAC") may be used. Eutectic compositions may be used to form the backside ball pads 180. The shape of the backside ball pads 180 is also not limited to a "ball" shape and columns, pillars, ovoids, towers, squares, rectangles and other shapes may be used.

In some embodiments, the second semiconductor devices 190 may be packaged semiconductor devices. For example, the second semiconductor device 190 may comprise a substrate 191, contact pads 192, semiconductor dies 194b, 194t and an encapsulant 195. In some embodiments, the substrate 191 may be, e.g., a packaging substrate comprising internal interconnects (e.g., through substrate vias 193) to connect the semiconductor dies 194b and 194t to the backside ball pads 180.

Alternatively, the substrate 191 may be an interposer used as an intermediate substrate to connect the semiconductor dies 194b and 194t to the backside ball pads 180. In some embodiments, the substrate 191 may be, e.g., a silicon substrate, doped or undoped, or an active layer of a silicon-on-insulator (SOI) substrate. However, the substrate 191 may alternatively be a glass substrate, a ceramic substrate, a polymer substrate, or any other substrate that may provide a suitable protection and/or interconnection functionality. These and any other suitable materials may alternatively be used for the substrate 191.

The bottom semiconductor die 194b may be a semiconductor device such as being a logic die, a central processing unit (CPU) die, a memory die (e.g., a DRAM die), combinations of these, or the like. In some embodiments, the bottom semiconductor die 194b comprises integrated circuit devices, such as transistors, capacitors, inductors, resistors, and the like therein.

The top semiconductor die 194t may be bonded to the bottom semiconductor die 194b. In some embodiments, the top semiconductor die 194t is physically bonded with the bottom semiconductor die 194b, such as by using an adhesive. In the depicted embodiments, the top semiconductor die 194t and the bottom semiconductor die 194b may be electrically connected to the substrate 191 using, e.g., wire bonds 196, although any suitable electrical bonding may be alternatively be utilized. Alternatively, the top semiconductor die 194t may be bonded to the bottom semiconductor die 194b physically and electrically.

The contact pads 192 may be formed on the substrate 191 to form electrical connections between the second semiconductor device 190 and the backside ball pads 180. In some embodiments, the contact pads 192 may be formed over and in electrical contact with electrical routing (such as through substrate vias 193) within the substrate 191. The contact pads 192 may comprise aluminum, but other materials, such as copper, may alternatively be used. The contact pads 192 may be formed using a deposition process, such as sputtering, to form a layer of material (not shown) and portions of the layer of material may then be removed through a suitable process (such as photolithographic masking and etching) to form the contact pads 192. However, any other suitable process may be utilized to form the contact pads 192.

The encapsulant 195 may be used to encapsulate and protect the bottom semiconductor die 194b, the top semiconductor die 194t, and the substrate 191. In some embodiments, the encapsulant 195 may be a molding compound and may be placed using a molding device. For example, the substrate 191, the bottom semiconductor die 194b, and the top semiconductor die 194t may be placed within a cavity of the molding device, and the cavity may be hermetically sealed. The encapsulant 195 may be placed within the cavity either before the cavity is hermetically sealed or else may be injected into the cavity through an injection port. In some embodiments, the encapsulant 195 may be a molding compound resin such as polyimide, polyphenylene sulfide (PPS), polyether ether ketone (PEEK), polyethersulfone (PES), a heat resistant crystal resin, epoxy resin, combinations of these, or the like.

Once the encapsulant 195 has been placed into the cavity such that the encapsulant 195 encapsulates the region around the substrate 191, the bottom semiconductor die 194b, and the top semiconductor die 194t, the encapsulant 195 may be cured in order to harden the encapsulant 195 for optimum protection. While the exact curing process is dependent at least in part on the particular material chosen for the encapsulant 195, in some embodiments in which molding compound is chosen as the encapsulant 195, the curing can occur through a process such as heating the encapsulant 195 to between about 100° C. and about 130° C., such as about 125° C. for about 60 sec to about 3000 sec, such as about 600 sec. Additionally, initiators and/or catalysts may be included within the encapsulant 195 to better control the curing process. However, as one having ordinary skill in the art will recognize, the curing process described above is merely an exemplary process and is not meant to limit the current embodiments. Other curing processes, such as irradiation or even allowing the encapsulant 195 to harden at ambient temperature, may alternatively be used. Any suitable curing process may be used, and all such processes are fully intended to be included within the scope of the embodiments discussed herein.

An underfill 200 can be at least formed among the second semiconductor devices 190 and the backside ball pads 180. The underfill 200 may be exemplarily dispensed as a liquid using a capillary underfill ("CUF") approach. A resin or epoxy liquid is flowed beneath the second semiconductor devices 190 and fills the space among the second semiconductor devices 190 and the backside ball pads 180. The underfill 200 may overfill the space between the backside ball pads 180 and is present on sidewalls of the second semiconductor devices 190, as shown in FIG. 18. Room temperature, UV, or thermal curing may be used to cure the underfill 200. The underfill 200 can provide mechanical strength and stress relief to the second semiconductor devices 190.

Figure 19:
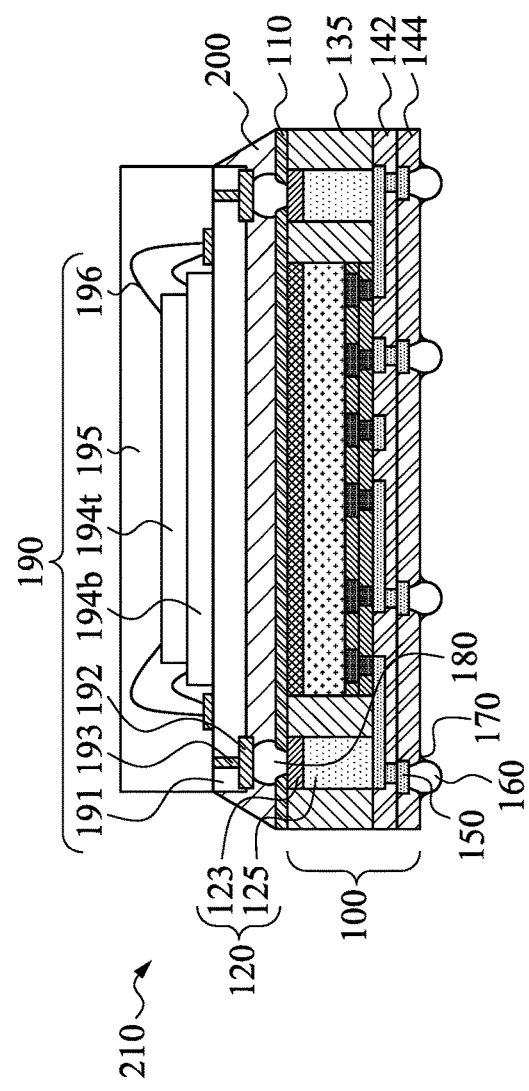

Thereafter, as shown in FIG. 19, a singulation process is performed to saw a combination of the TIV package 100, the second semiconductor devices 190, and the underfill 200 into a plurality of individual package structures 210. The dicing tape DT can be removed as well.

Embodiments of the present disclosure may have at least following advantages. UBM structures are absent between the conductive bumps and the dielectric layer, and hence cost for forming the UBM structures can be saved. Moreover, even if the package structure becomes susceptible to peeling issues due to absence of the UBM structures, sealing structures surrounding bottom portions of the conductive bumps can prevent the peeling issues, and hence ball shear performance and waterproof ability can be improved. Moreover, because the sealing structures are formed by dispensing sealing material droplets onto selected positions around the conductive bumps, residues of the dispensing process on unwanted regions of the conductive bumps (e.g. top portions of the conductive bumps) can be prevented.

In accordance with some embodiments of the present disclosure, a package structure includes a semiconductor device, a first redistribution line, a dielectric layer, a first conductive bump and a first sealing structure. The dielectric layer is over the first redistribution line and has a first opening therein. The first conductive bump is partially embedded in the first opening and electrically connected to the first redistribution line. The first sealing structure surrounds a bottom portion of the first conductive bump. The first sealing structure has a curved surface extending from an outer surface of the bottom portion of the first conductive bump to a top surface of the dielectric layer.

In accordance with some embodiments of the present disclosure, a package structure includes a semiconductor device, a first redistribution line, a dielectric layer, a first conductive bump and a first sealing structure. The first redistribution line is electrically connected to the semiconductor device. The dielectric layer is over the first redistribution line and has a first opening therein. The first conductive bump is partially embedded in the first opening and electrically connected to the first redistribution line. The first sealing structure surrounds a bottom portion of the first conductive bump. A top portion of the first conductive bump is free of the first sealing structure.

In accordance with some embodiments of the present disclosure, a method of forming a package structure includes forming a redistribution line electrically connected to a semiconductor device, forming a dielectric layer over the redistribution line, forming an opening in the dielectric layer to expose the redistribution line, forming a conductive bump in the opening, wherein the conductive bump is electrically connected to the redistribution line, and dispensing sealing material droplets around the conductive bump to form a sealing structure around the conductive bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor device;
   a first redistribution line electrically connected to the semiconductor device;
   a dielectric layer over the first redistribution line and having a first opening therein;
   a first conductive bump partially embedded in the first opening and electrically connected to the first redistribution line; and
   a first printed sealing structure surrounding a bottom portion of the first conductive bump, wherein an interface between the dielectric layer and the first conductive bump has a topmost edge in a position lower than a topmost location of the dielectric layer, an interface between the first printed sealing structure and the dielectric layer has a rounded corner, the first printed sealing structure is configured to block moisture penetration, when viewed from above, the first printed sealing structure includes a plurality of overlapping circular patterns, and circumferences of neighboring two of the plurality of overlapping circular patterns meet to form a sharp point.

2. The package structure of claim 1, wherein the first printed sealing structure has a portion between the first conductive bump and the dielectric layer.

3. The package structure of claim 2, wherein curving of a curved surface of the first printed sealing structure begins from an outer surface of the bottom portion of the first conductive bump to a top surface of the dielectric layer.

4. The package structure of claim 1, further comprising:
   a second redistribution line electrically connected to the semiconductor device, wherein the dielectric layer is over the second redistribution line and having a second opening therein;
   a second conductive bump partially embedded in the second opening and electrically connected to the second redistribution line; and
   a second printed sealing structure surrounding a bottom portion of the second conductive bump, wherein the first and second printed sealing structures are spaced apart.

5. The package structure of claim 4, wherein the second printed sealing structure has a curved surface extending from an outer surface of the bottom portion of the second conductive bump to a top surface of the dielectric layer.

6. The package structure of claim 1, wherein the first printed sealing structure is made of polymer.

7. The package structure of claim 1, wherein the first conductive bump has a top in a position higher than a top of the first printed sealing structure.

8. The package structure of claim 1, wherein the first printed sealing structure has a curved surface extending from an outer surface of the bottom portion of the first conductive bump to a top surface of the dielectric layer.

9. A package structure, comprising:
   a semiconductor device;
   a first redistribution line electrically connected to the semiconductor device;
   a dielectric layer over the first redistribution line and having a first opening therein;
   a first conductive bump partially embedded in the first opening and electrically connected to the first redistribution line; and
   a moisture-penetration preventing structure surrounding a bottom portion of the first conductive bump, wherein a top portion of the first conductive bump is free of the moisture-penetration preventing structure, the moisture-penetration preventing structure has a portion below a topmost location of the dielectric layer, the portion of the moisture-penetration preventing structure has a width decreasing as a distance from the first redistribution line decreases, the portion of the moisture-penetration preventing structure has a pointed end at a bottommost position of the portion of the moisture-penetration preventing structure and a curved surface extending from the pointed end along the dielectric layer, when viewed from above, the moisture-penetration preventing structure includes a plurality of overlapping circular patterns, and circumferences of neighboring two of the plurality of overlapping circular patterns meet to form a sharp point.

10. The package structure of claim 9, wherein the moisture-penetration preventing structure is in contact with the first conductive bump.

11. The package structure of claim 9, wherein the moisture-penetration preventing structure is in contact with the dielectric layer.

12. The package structure of claim 9, wherein the portion of the moisture-penetration preventing structure is between the first conductive bump and the dielectric layer.

13. The package structure of claim 9, wherein the first conductive bump is in contact with the first redistribution line.

14. The package structure of claim 9, wherein the first conductive bump is in contact with the dielectric layer.

15. The package structure of claim 9, wherein the portion of the moisture-penetration preventing structure has a bottom tip in contact with an interface between the dielectric layer and the first conductive bump.

16. The package structure of claim 9, wherein the moisture-penetration preventing structure is made of polymer.

17. A package structure, comprising:
   a semiconductor die;
   a dielectric layer over the semiconductor die;
   a solder ball partially in the dielectric layer and electrically connected to the semiconductor die; and
   a printed sealing structure abutting the solder ball, wherein an interface between the printed sealing structure and the dielectric layer meets an interface between the printed sealing structure and the solder ball at a location lower than a topmost location of the dielectric layer, the interface between the printed sealing structure and the dielectric layer has a rounded corner, and when viewed from above, the printed sealing structure resembles an annular pattern with a perimeter formed of a plurality of circular arcs and a plurality of discontinuities in curvature where the circular arcs meet.

18. The package structure of claim 17, wherein a portion of the printed sealing structure is horizontally between the dielectric layer and the solder ball.

19. The package structure of claim 17, wherein a portion of the printed sealing structure has a concave surface extending from the solder ball to the topmost location of the dielectric layer.

20. The package structure of claim 17, wherein the printed sealing structure has an upwardly tapered portion above the topmost location of the dielectric layer and a downwardly tapered portion below the topmost location of the dielectric layer.

* * * * *